United States Patent
Jenniskens et al.

(10) Patent No.: US 7,176,687 B2
(45) Date of Patent: Feb. 13, 2007

(54) T1-WEIGHTED MULTIECHO MAGNETIC RESONANCE IMAGING

(75) Inventors: Hans Gerard Jenniskens, Eindhoven (NL); Johan Samuel Van Den Brink, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 200 days.

(21) Appl. No.: 10/510,853

(22) PCT Filed: Mar. 27, 2003

(86) PCT No.: PCT/IB03/01264

§ 371 (c)(1),
(2), (4) Date: Oct. 12, 2004

(87) PCT Pub. No.: WO03/087864

PCT Pub. Date: Oct. 23, 2003

(65) Prior Publication Data
US 2005/0119554 A1 Jun. 2, 2005

(30) Foreign Application Priority Data
Apr. 16, 2002 (EP) .................. 02076502

(51) Int. Cl.
*G01V 3/00* (2006.01)
*A61B 5/55* (2006.01)

(52) U.S. Cl. ............... 324/309; 324/313; 324/318; 600/410

(58) Field of Classification Search .............. None
See application file for complete search history.

(56) References Cited

U.S. PATENT DOCUMENTS 4,683,433 A   7/1987   Yamamoto et al.
4,707,658 A * 11/1987   Frahm et al. ............ 324/309

(Continued)

OTHER PUBLICATIONS

Becker, et al.; Driven Equilibrium Fourier Transform Spectroscopy; J. of Amer. Chemical Society; 1969, vol. 91, No. 27; pp. 7784-7785.

(Continued)

*Primary Examiner*—Brij Shrivastav
*Assistant Examiner*—Tiffany A Fetzner
(74) *Attorney, Agent, or Firm*—Thomas M. Lundin

(57) ABSTRACT

In a method for magnetic resonance imaging of at least a portion of a body placed in a stationary and substantially homogeneous main magnetic field, the body is subjected to a sequence of RF and magnetic field gradient pulses during an interval TSE, thereby generating a plurality of spin echo signals, which are measured and processed for reconstruction of an image. Thereafter, during an interval TDRV, an additional spin echo is generated by subjecting the body to at least one further refocusing RF pulse and/or magnetic field gradient pulse, and a RF drive pulse ($\beta_X$) is irradiated at the time of this additional spin echo. In order to provide a fast and reliable method for $T_1$-weighted imaging, which gives a high $T_1$ contrast and also a sufficient signal-to-noise ratio, the phase of the RF drive pulse ($\beta_X$) is selected such that nuclear magnetization at the time of the additional spin echo is transformed into negative longitudinal magnetization. The sequence is repeated beginning with another sequence of RF and magnetic field gradient pulses after a recovery period TREC.

16 Claims, 2 Drawing Sheets

U.S. PATENT DOCUMENTS

| | | | |
|---|---|---|---|
| 5,214,382 A * | 5/1993 | Harms et al. | 324/309 |
| 5,245,282 A * | 9/1993 | Mugler et al. | 324/309 |
| 5,908,386 A | 6/1999 | Ugurbil et al. | |
| 6,054,853 A | 4/2000 | Miyamoto et al. | |
| 6,064,203 A * | 5/2000 | Bottomley | 324/309 |
| 6,219,571 B1 | 4/2001 | Hargreaves et al. | |
| 6,252,400 B1 * | 6/2001 | Loncar et al. | 324/307 |
| 6,771,069 B2 * | 8/2004 | Asano et al. | 324/309 |
| 2005/0119554 A1 * | 6/2005 | Jenniskens et al. | 600/410 |

OTHER PUBLICATIONS

Busse, et al.; Interactive Fast Spin-Echo Imaging; Magnetic Resonance in Medicine; 2000, vol. 44; pp. 339-348.

Conturo, et al.; Cooperative T1 and T2 Effects on Contrast Using a New Driven Inversion..; Magnetic Resonance in Medicine; 1990; vol. 15, pp. 397-419.

Gyngell, M.L.; The Application of Steady-State Free Precession in Rapid 2DFT NMR Imaging; Magnetic Resonance Imaging, 1988, vol. 6; pp. 415-419.

Hargreaves, et al.; MR Imaging of Articular Carilage Using Driven Equilibrium; Magnetic Resonance in Medicine; 1999; vol. 42, pp. 695-703.

Kangarlu, et al.; T1 and T2 Weighted Imaging at 8 Tesla; Journal of Computer Assisted Tomography; 1999, vol. 23, No. 6, pp. 875-877.

Mugler, et al.; T2-weighted Three-dimensional MP-Rage MR Imaging; J. of Magnetic Resonance Imaging; 1999; vol. 1, pp. 731-737.

Norris, D.G.; Reduced Power Multislice MDEFT Imaging; J. Of Magnetic Resonance Imaging; 2000; vol. 11, pp. 445-451.

Parrish, et al.; A New T2 Preparation Technique for Ultrafast Gradient-Echo Sequence; Magnetic Resonance in Medicine; 1994; vol. 32; pp. 652-657.

Van Uijen, et al.; Driven-Equilibrium Radiofrequency Pulses in NMR Imaging; Magnetic Resonance in Medicine; 1984, vol. 1; pp. 502-507.

* cited by examiner

T1-WEIGHTED MULTIECHO MAGNETIC RESONANCE IMAGING

BACKGROUND

The invention relates to a method for magnetic resonance imaging. In magnetic resonance imaging (MRI), pulse sequences including RF and magnetic field gradient pulses are applied to an object (a patient) to generate magnetic resonance signals, which are scanned in order to obtain information therefrom and to reconstruct images of the object. Since its initial development, the number of clinical relevant fields of application of MRI has grown enormously. MRI can be applied to almost every part of the body, and it can be used to obtain information about a number of important functions of the human body. The pulse sequence which is applied during an MRI scan determines characteristics of the reconstructed images, such as location and orientation in the object, dimensions, resolution, signal-to-noise ratio, contrast, sensitivity for movements, etcetera. An operator of a MRI device chooses the appropriate sequence and adjusts and optimizes its parameters for the respective application.

$T_2$-contrast enhanced spin echo sequences are the most widely used scans in clinical application because they provide exquisite soft tissue contrast. However, their utility is limited by their long acquisition time. This is why fast $T_2$-contrast enhanced sequences have been the object of recent developments. Known techniques, which are capable of producing $T_2$-weighted images within a few seconds, are spin echo sequences like the so-called RARE (rapid acquisition by repeated echoes) and TSE (turbo spin echo) sequences. The known spin echo sequences usually consist of an initial contrast preparation period and a subsequent data acquisition period. During the first period the longitudinal magnetization is prepared according to the desired contrast while many phase-encoded echoes are generated and acquired during the second period to form the image.

A $T_2$-contrast enhanced MRI method which is particularly useful for imaging of tissue with a high $T_2/T_1$ ratio is known from the U.S. Pat. No. 6,219,571 B1. This technique uses a so-called driven equilibrium Fourier transform (DEFT) sequence, which enhances signal strength without waiting for full $T_1$ recovery. DEFT imaging provides particularly high contrast between tissues with different values of $T_2$ while maintaining a high signal to noise ratio. The typical DEFT pulse sequence begins with a slice-selective RF excitation pulse ($\alpha_X$) followed by a plurality of 180°$_Y$ refocusing pulses resulting in phase encoded spin echoes, which are used for imaging. At the last spin echo, a "driven equilibrium" (or simply "drive") pulse ($-\alpha_X$) transforms the remaining transverse magnetization into positive longitudinal magnetization. An optional gradient pulse at the end of the sequence might help to spoil residual transverse magnetization. This pulse sequence is then repeated after a recovery period which is shorter than the $T_1$ of the examined tissue.

It is well known that also the generation of high quality $T_1$-contrast enhanced images is essential for many MRI applications. This is particularly valid for the examination of the human brain. For example, the significant difference between the longitudinal relaxation times of white matter tissue and cerebra spinal fluid can be utilized to produce images with high contrast between these two materials. The main drawback of the well-known inversion recovery (IR) techniques, which are routinely employed for $T_1$-weighted imaging, is again their comparatively long acquisition time.

Adequate and efficient $T_1$-weighted imaging is especially challenging at high magnetic fields of 3 Tesla or more, as a significant increase of $T_1$ is then observed.

Therefore it is readily appreciated that there is a need for MRI methods which enable a fast $T_1$-contrast enhanced imaging. It is consequently the primary object of the present invention to provide a fast and reliable method for $T_1$-weighted imaging, which gives a high $T_1$ contrast and also a sufficient signal-to-noise ratio.

SUMMARY

In accordance with the present invention, a method for magnetic resonance imaging of the type specified above is disclosed, wherein the aforementioned object is achieved by selecting the phase of said RF drive pulse such that nuclear magnetization at the time of said additional spin echo is transformed into negative longitudinal magnetization.

The present invention enables to perform fast tomographic scanning with significantly enhanced $T_1$ contrast. While the method of the invention is particularly valuable for TSE (turbo spin echo) imaging, it can also be applied to any spin echo based imaging sequence. The structure of the sequence of the invention is similar to the above-described DEFT sequence. But the essential difference is that the remaining magnetization after the spin echo data acquisition (i.e. in most cases mainly transverse magnetization) is transformed into negative longitudinal magnetization. It turns out that this difference causes the desired $T_1$-contrast enhancement instead of the $T_2$-enhancement which is obtained with the known DEFT method.

In accordance with one aspect, a magnetic resonance imaging method is proided in which at least a portion of a body placed in a stationary and substantially homogeneous main magnetic field, the method comprising the following steps:

a) subjecting said portion of a body to a sequence of at least one RF pulse and at least one magnetic field gradient pulse, thereby generating one or more spin echo signals in said portion;

b) measuring said spin echo signals for reconstructing an image from said signals;

c) generating all additional spin echo by subjecting said portion to at least one further refocusing RF pulse and/or magnetic field gradient pulse;

d) subjecting said portion to a RF drive pulse at the time of said additional spin echo;

e) repeating steps a) to d) with the pulse sequence of step a) beginning after a recovery period By generating the additional spin echo in step c) after the imaging readout in step b) all transverse magnetization is refocused. As already described above, the magnetization is then transformed into negative longitudinal magnetization by applying the RF drive pulse at this echo in step d). If the excitation angle of the spin echo sequence in step a) is not equal to 90°, the RE drive pulse will generally also not be equal to 90' in order to achieve optimal contrast enhancement. In case substantial $T_1$ decay takes place during the readout period in step b), the flip angle of the drive pulse will generally be larger than 90°, since an optimal signal will be obtained by generating as much negative longitudinal magnetization as possible. By allowing $T_1$ decay after the RE drive pulse in the recovery period of step e) before the next excitation begins in step a), a $T_1$-contrast enhancement is obtained similar to the known inversion recovery technique. In contrast to IR the inversion is not performed by a 180° pulse, but by the RF drive pulse which is irradiated when the transverse magnetization is coherent (refocused). This mechanism of the invention results in a very compact sequence, allowing for short repetition times and hence high $T_1$ contrast. Furthermore, the method of the present invention is simple, robust, and fast and can easily be implemented on any magnetic resonance imaging apparatus in clinical operation.

With this method, it is advantageous if the sequence of step a) begins with a substantially 90° RF pulse. A maximum of initial magnetization can be obtained in this way. In case only little $T_1$ decay takes place during the readout period of step b), it is practical if the drive pulse of step d) is a substantially 90° RF pulse as well, since the nuclear magnetization, which is mainly transverse magnetization, will be almost completely transformed into negative longitudinal magnetization in this way. In a practical implementation, the sequence of step a) begins with an RF pulse, which has substantially the same flip angle as the drive pulse of step d), both the initial RF pulse of step a) and the drive pulse of step d) also having substantially the same RF phase. Again in case only little $T_1$ decay takes place during the readout period of step b), both the initial RF pulse of step a) and the drive pulse of step d) will preferably have a flip angle of about 90°.

Experiments and numerical simulations show that with this method, it is advantageous if the pulse sequence of step a) is a turbo spin echo (TSE) sequence beginning with a substantially 90° X-pulse followed by a series of 180° Y-pulses, wherein the drive pulse is again a substantially 90° X-pulse. The 180° refocusing pulses can be replaced by so-called composite pulses, which also result in a 180° tip of the magnetization, in order to make the method still less sensitive to variations in $B_0$ (i.e. the main magnetic field) and $B_1$ (i.e. the RF field). For optimizing the sequence, it is further possible to incorporate a flip angle sweep for the refocusing pulses.

The method for magnetic resonance imaging of the invention is also well-suited to be used with other known spin echo based imaging sequences in step a), such as a RARE (rapid acquisition by repeated echoes) sequence, an EPI (echo planar imaging) sequence, or a GRASE (gradient and spin echo) sequence.

With the method of the invention it turns out that the $T_1$ contrast between different materials can in most cases be optimized if the duration of the recovery period is selected such that it is larger than the shortest $T_1$. But in general the optimization of the parameters of the sequence in terms of contrast, speed, and signal-to-noise is strongly dependend on the ratios of the different $T_1$ values and the signal strength of the different materials under examination.

It is easily possible to incorporate this method in a dedicated device for magnetic resonance imaging of a body placed in a stationary and substantially homogeneous main magnetic field. Such a MRI scanner comprises means for establishing the main magnetic field, means for generating gradient magnetic fields superimposed upon the main magnetic field, means for radiating RF pulses towards the body, control means for controlling the generation of the gradient magnetic fields and the RF pulses, means for receiving and sampling magnetic resonance signals generated by sequences of RF pulses and switched gradient magnetic fields, and reconstruction means for forming an image from said signal samples. In accordance with the invention, the control means, which is usually a microcomputer with a memory and a program control, comprises a programming with a description of an imaging procedure according to the above-described method of the invention. For interactive scanning, an input means may be provided, which enables an operator of the device to adjust the flip angle and the RF phase of the drive pulse of step d) as well as the duration of the recovery period of step e) while the imaging procedure is in progress. An appropriate user interface will then allow for an interactive optimization of the desired contrast.

BRIEF DESCRIPTION OF THE DRAWINGS

The following drawings disclose preferred embodiments of the present invention. It should be understood, however, that the drawings are designed for the purpose of illustration only and not as a definition of the limits of the invention.

DETAILED DESCRIPTION

Figure 1:
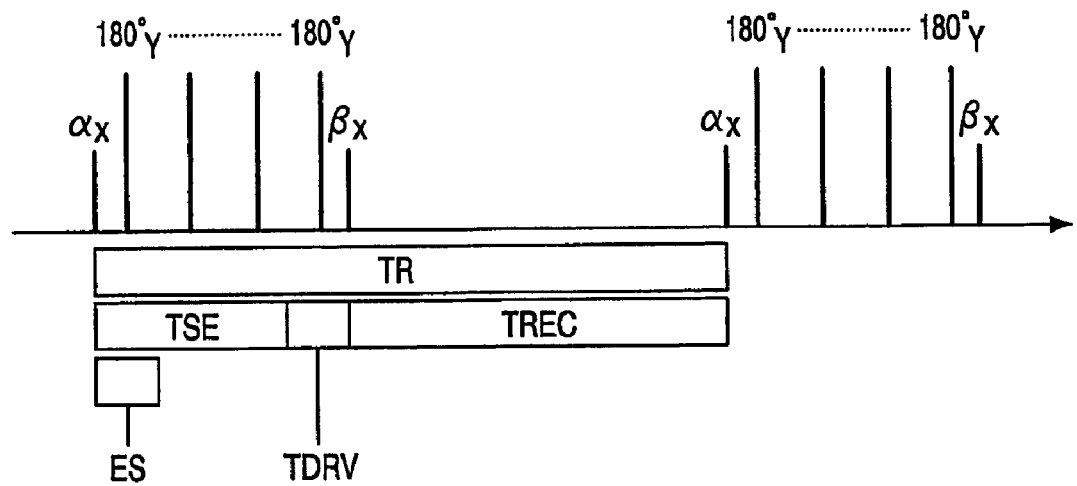
FIG. 1 shows a diagram of a pulse sequence in accordance with the present invention.

A sequence design in accordance with the present invention is depicted in FIG. 1. The sequence begins with a—typically slice selective—RF excitation pulse $\alpha_X$. This pulse tips the magnetization through an angle $\alpha$ about the x-axis. In most spin echo sequences, the first pulse will have an excitation angle of 90°. A series of $180°_Y$ refocusing pulses following the first pulse result in a plurality of spin echoes which are not represented in the figure. The $180°_Y$ pulses and the spin echoes are separated by a time interval ES (echo spacing). The spin echoes are measured during a readout interval TSE. These registered signals are subsequently used for imaging. Images can for example be reconstructed by subjecting the acquired data to a well-known 2D FT-procedure. During the interval TSE, the depicted sequence corresponds to a usual turbo spin echo sequence. But after the last pulse of the TSE interval, an additional spin echo is generated by a further 180° y pulse. At this spin echo, an $\beta_X$ drive pulse tips the remaining coherent magnetization to the negative longitudinal axis. The TSE sequence is thus extended by an additional interval TDRV, after which the transverse magnetization has been transformed into negative longitudinal magnetization. A subsequent gradient pulse, which is not represented in the figure, optionally helps to spoil residual transverse magnetization. Another TSE sequence begins with a $\alpha_X$ excitation pulse after a recovery period TREC, during which $T_1$-relaxation is allowed to take place. The repetition time of the sequence is TR. $\alpha$ and $\beta$ will be equal, if no significant $T_1$ decay takes place during the TSE readout.

Figure 2:
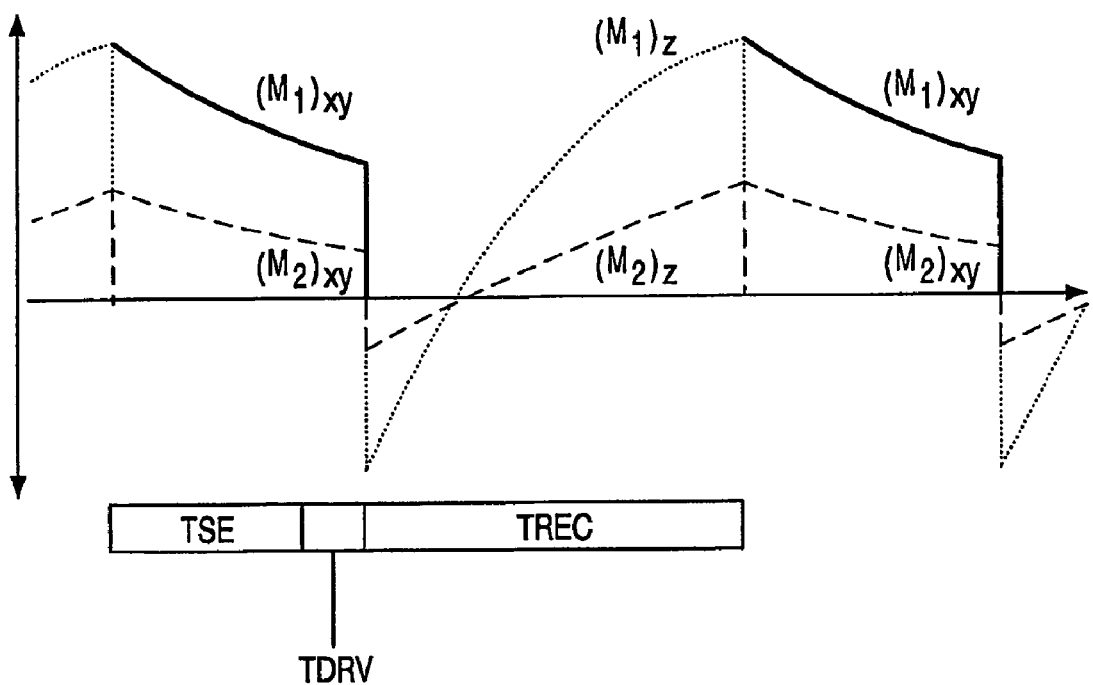
FIG. 2 shows steady-state magnetizations during the sequence of FIG. 1.

The temporal development of the steady state magnetization during the sequence of FIG. 1 is shown in FIG. 2. The figure shows magnetizations $M_1$ and $M_2$ of two different materials (for example white matter and cerebra spinal fluid of the human brain), wherein the longitudinal relaxation time of the first material is much shorter than the relaxation time of the second material. During the first part of the sequence, which is composed of the intervals TSE and TDRV, the magnetizations $M_1$ and $M_2$ are in the transverse x,y-plane, where transverse relaxation takes place. During the recovery period TREC, the magnetizations are directed along the longitudinal z-axis. As depicted in the figure, longitudinal relaxation with two different rates takes place during this period. By allowing $T_1$ relaxation during TREC after the drive pulse until the next excitation, a $T_1$ contrast enhancement is obtained similar to the known IR technique.

The inversion is not performed by a 180° pulse, but by the $\beta_X$ drive pulse at a point in time when the transverse magnetization is coherent. Therefore, the method of the invention can also be characterized as "coherent inversion recovery". The mechanism of the invention allows for a compact sequence with short TR and high $T_1$ contrast. The different amplitudes of the $M_1$ and $M_2$ magnetizations during the data acquisition interval TSE can clearly be seen in FIG. 2. This difference results from the fast ($M_1$) and slow ($M_2$) relaxation during TREC.

Figure 3:
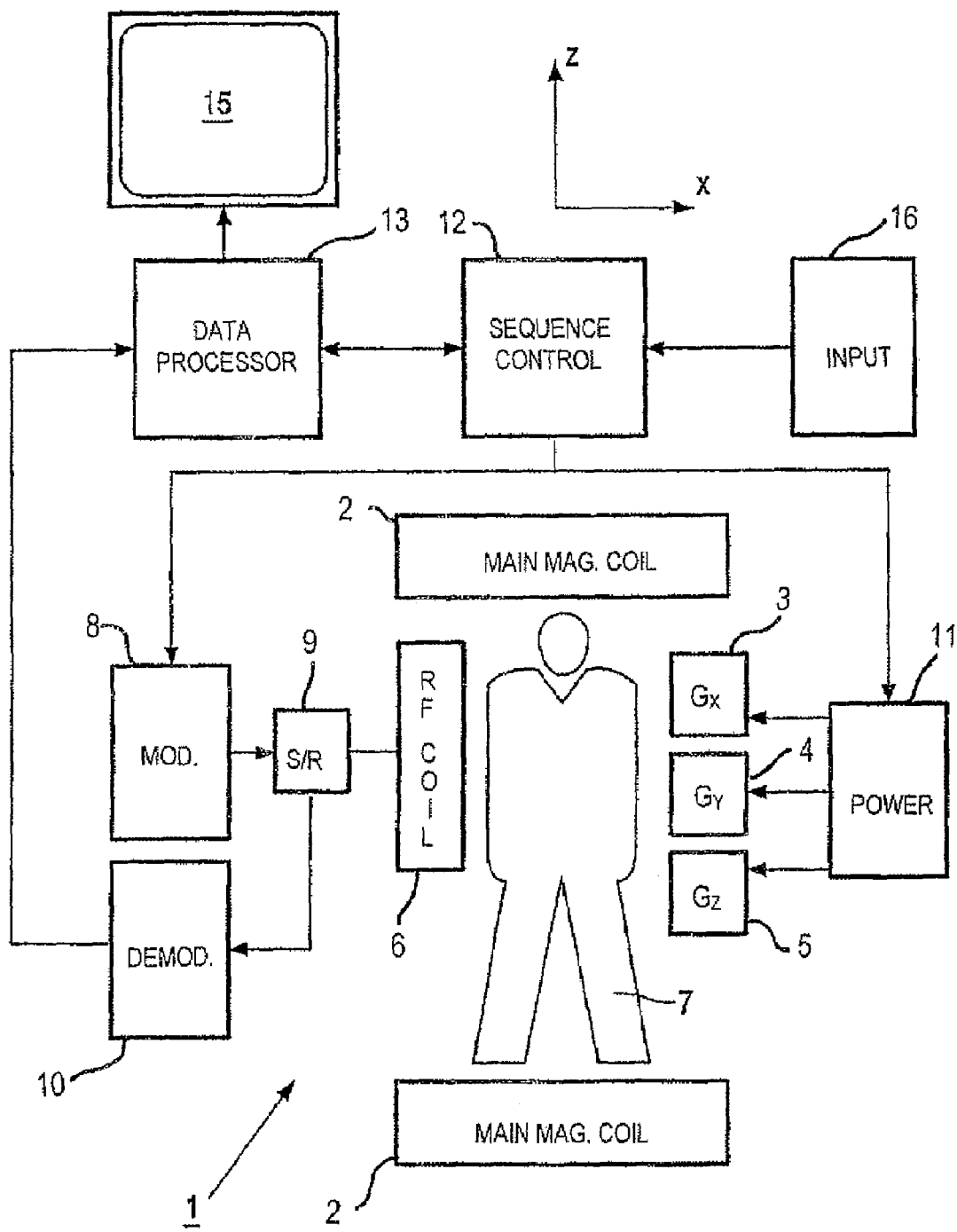
FIG. 3 shows an embodiment of a MRI scanner according to the invention.

In FIG. 3 a magnetic resonance imaging device 1 is diagrammatically shown. The apparatus 1 comprises a set of main magnetic coils 2 for generating a stationary and homogeneous main magnetic field and three sets of gradient coils 3, 4 and 5 for superimposing additional magnetic fields, e.g. $G_x$, $G_y$, $G_z$, with controllable strength and having a gradient in a selected direction. Conventionally, the direction of the main magnetic field is labelled the z-direction, the two directions perpendicular thereto the x- and y-directions. The gradient coils are energized via a power supply 11. The apparatus 1 further comprises a radiation emitter 6, such as an antenna or RF coil, for emitting radio frequency (RF) pulses to a body 7, the radiation emitter 6 being coupled to a modulator 8 for generating and modulating the RF pulses. Also provided is a receiver for receiving the MR-signals, the receiver can be identical to the emitter 6 or be separate. If the emitter and receiver are physically the same antenna or coil as shown in FIG. 3, a send-receive switch 9 is arranged to separate the received signals from the pulses to be emitted. The received MR-signals are input to a demodulator 10. The modulator 8, the emitter 6 and the power supply 11 for the gradient coils 3, 4 and 5 are controlled by a sequence control system 12 to generate the above-described sequence of RF pulses and a corresponding sequence of magnetic field gradient pulses. The control system is usually a microcomputer with a memory and a program control. For the practical implementation of the invention it comprises a programming with a description of an imaging procedure according to the above-described method. The demodulator 10 is coupled to a data processing unit 14, for example a computer, for transformation of the received echo signals into an image that can be made visible, for example on a visual display unit 15. There is an input means 16, e.g. an appropriate keyboard, connected to the control system 12, which enables an operator of the device to interactively adjust the flip angle and the RF phase of the drive pulse as well as the duration of the recovery period in order to optimize contrast and signal-to-noise.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A method for acquiring magnetic resonance imaging data of at least a portion of a body placed in a stationary and substantially homogeneous main magnetic field, the method comprising the following steps:
   a) subjecting said portion of a body to a sequence of at least one RF pulse and at least one magnetic field gradient pulse;
   b) applying one or more refocusing pulses to generate one or more spin echo signals in said portion;
   c) measuring said spin echo signals in order to acquire magnetic resonance imaging data for reconstructing at least one magnetic resonance image from said acquired magnetic resonance imaging data;
   d) generating an additional spin echo by subjecting said portion to at least one further refocusing RF pulse and/or magnetic field gradient pulse;
   e) subjecting said portion to a RF drive pulse at the time of said additional spin echo, which RF drive pulse is selected such that nuclear magnetization at the time of said additional spin echo is transformed into negative longitudinal magnetization;
   f) allowing the negative longitudinal magnetization to recover to positive longitudinal magnetization without application of RF drive pulses during a recovery period for optimizing the image contrast between tissues with different values of T1 the duration of said recovery period being selected such that it is larger than the shortest T1;
   g) repeating steps a) to f) with the pulse sequence of step a) beginning after the recovery period in order to incorporate the optimized T1 contrast from step f) into the acquired magnetic resonance imaging data.

2. The method for magnetic resonance imaging according to claim 1, wherein the sequence of step a) begins with a substantially 90° RF pulse.

3. The method for magnetic resonance imaging according to claim 1, wherein the drive pulse of step e) is a substantially 90° RF pulse.

4. The method for magnetic resonance imaging according to claim 1, wherein the sequence of step a) begins with a RF pulse, which has substantially the same flip angle as the drive pulse of step e), both the initial RF pulse of step a) and the drive pulse of step e) also having substantially the same RF phase.

5. The method for magnetic resonance imaging according to claim 4, wherein both the initial RF pulse of step a) and the drive pulse of step e) have a flip angle of about 90°.

6. The method for magnetic resonance imaging according to claim 1, wherein the pulse sequence of step a) is a turbo spin echo (TSE) sequence beginning with a substantially 90° X-pulse followed by a series of 180° Y-pulses, wherein said drive pulse is again a substantially 90° X-pulse.

7. The method for magnetic resonance imaging according to claim 1, wherein the pulse sequence of step a) is a RARE (rapid acquisition by repeated echoes) sequence, an EPI (echo planar imaging) sequence, or a GRASE (gradient and spin echo) sequence.

8. The method according to claim 1, wherein no RF pulses are applied during step f) of a next repetition of the sequence.

9. A device configured for magnetic resonance imaging of a body placed in a stationary and substantially homogeneous main magnetic field, the device comprising means for establishing the main magnetic field, means for generating gradient magnetic fields superimposed upon the main magnetic field, means for radiating RF pulses towards the body, control means for controlling the generation of the gradient magnetic fields and the RF pulses, means for receiving and sampling magnetic resonance signals generated by sequences of RF pulses and switched gradient magnetic fields, means for acquiring magnetic resonance imaging data, and reconstruction means for forming a magnetic resonance image from said acquired magnetic resonance imaging data, wherein the control means comprises means for performing a magnetic resonance imaging data acquisition according to the method of claim 1.

10. The device configured for magnetic resonance imaging according to claim 9, further comprising an input means for enabling an operator of the device to interactively adjust a flip/tip angle and an RF phase of the drive pulse of step e) as well as the duration of the recovery period of step f).

11. A magnetic resonance method comprising:
 a) applying an RF excitation pulse to a subject in a static magnetic field in order to tip positive longitudinal magnetization into transverse magnetization;
 b) applying one or more RF inversion pulses to the subject in order to refocus the transverse magnetization into one or more spin echoes;
 c) measuring said spin echo signals in order to acquire magnetic resonance imaging data for reconstructing at least one magnetic resonance image;
 d) applying an RF drive pulse to the subject in order to tip the transverse magnetization into negative longitudinal magnetization and, without applying additional RF pulses to the subject, allowing the negative longitudinal magnetization to recover during a recovery period to positive longitudinal magnetization causing enhanced T1 contrast;
 e) after the recovery period, repeating steps a)–d) in order to incorporate the enhanced T1 contrast into the acquired magnetic resonance imaging data.

12. The method according to claim 11 further including:
reconstructing the acquired magnetic resonance data to generate a magnetic resonance image of a portion of the subject.

13. The method according to claim 12 wherein the RF excitation pulse and the RF drive pulse have the same RF phase.

14. The method according to claim 13 wherein the RF excitation pulse and the RF drive pulse have a same flip angle.

15. A magnetic resonance apparatus comprising:
 a main magnet which creates a longitudinal main magnetic field with which dipoles of a portion of a subject in the main magnetic field align to form positive longitudinal magnetization;
 an RF system configured to generate RF pulses and receives RF signals; and
 a control system configured to control at least the RF system to perform the magnetic resonance method of claim 11 in order to acquire magnetic resonance imaging data with enhanced T1 contrast.

16. The magnetic resonance apparatus according to claim 15, further including:
 a data processing unit configured to process the acquired magnetic resonance imaging data with enhanced T1 contrast to reconstruct a magnetic resonance image of the portion of the subject.

* * * * *